(12) United States Patent
Takeda et al.

(10) Patent No.: US 10,734,910 B2
(45) Date of Patent: Aug. 4, 2020

(54) AIR CONDITIONER AND RECTIFIER

(71) Applicant: Samsung Electronics Co., Ltd., Suwon-si, Gyeonggi-do (KR)

(72) Inventors: Yuichi Takeda, Yokohama (JP); Yasuyuki Yamada, Yokohama (JP); Yoshiya Nishimaki, Yokohama (JP)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/177,194

(22) Filed: Oct. 31, 2018

(65) Prior Publication Data

US 2019/0128555 A1 May 2, 2019

(30) Foreign Application Priority Data

Nov. 2, 2017 (JP) .................................. 2017-212390
Jul. 13, 2018 (KR) ........................ 10-2018-0081550

(51) Int. Cl.
*H02M 5/458* (2006.01)
*F24F 11/88* (2018.01)
*H02M 1/12* (2006.01)
*H03K 7/08* (2006.01)
*H02M 7/217* (2006.01)
(Continued)

(52) U.S. Cl.
CPC ........... *H02M 5/4585* (2013.01); *F24F 11/88* (2018.01); *H02M 1/12* (2013.01); *H02M 1/4216* (2013.01); *H02M 7/217* (2013.01); *H03K 7/08* (2013.01); *H02M 1/4225* (2013.01); *H02M 1/44* (2013.01); *H02M 7/06* (2013.01); *H02M 7/219* (2013.01); *H02M 7/53871* (2013.01);
(Continued)

(58) Field of Classification Search
CPC ............ H02M 5/40; H02M 5/42; H02M 5/44; H02M 5/453; H02M 5/456; H02M 5/458; H02M 5/4585; H02M 1/44; H02M 1/12; H02M 7/53875; H02M 7/219; H02M 2001/0009; F24F 11/88; H03K 7/08
USPC .............................................. 363/34, 35, 37
See application file for complete search history.

(56) References Cited

U.S. PATENT DOCUMENTS 6,181,583 B1 * 1/2001 Okui ................... H02M 1/4208
363/45
8,823,303 B2 * 9/2014 Shinomoto ......... H02M 1/4225
318/400.29

(Continued)

FOREIGN PATENT DOCUMENTS

EP 2309635 A1 4/2011
JP 2002176778 A 6/2002
(Continued)

OTHER PUBLICATIONS

ISA/KR, "International Search Report," Application No. PCT/KR2018/013052, dated Feb. 28, 2019, 3 pages.

*Primary Examiner* — Alex Torres-Rivera

(57) ABSTRACT

Disclosed herein is an air conditioner including: a rectifier including a plurality of capacitors connected in series to each other, a switching device configured to control a flow of current supplied to the respective capacitors to charge or discharge the plurality of capacitors, a voltage detector configured to detect an output voltage of the plurality of capacitors, and a current detector configured to detect the current; and an inverter configured to generate alternating current by receiving an output voltage of the rectifier.

21 Claims, 7 Drawing Sheets

(51) Int. Cl.
  *H02M 1/42* (2007.01)
  *H02M 1/44* (2007.01)
  *H02M 1/00* (2006.01)
  *H02M 7/219* (2006.01)
  *H02M 7/5387* (2007.01)
  *H02M 7/06* (2006.01)

(52) U.S. Cl.
  CPC .. *H02M 7/53875* (2013.01); *H02M 2001/009* (2013.01); *H02M 2001/0009* (2013.01)

(56) References Cited

U.S. PATENT DOCUMENTS

| | | | |
|---|---|---|---|
| 9,960,703 B2* | 5/2018 | Hatakeyama | H02M 3/158 |
| 2011/0134672 A1* | 6/2011 | Sato | H02M 1/10 363/126 |
| 2014/0271272 A1 | 9/2014 | Jeon et al. | |
| 2015/0145446 A1 | 5/2015 | Shitabo | |
| 2016/0248352 A1 | 8/2016 | Shinomoto et al. | |
| 2016/0265822 A1* | 9/2016 | Kamiya | H02M 7/062 |

FOREIGN PATENT DOCUMENTS

| | | |
|---|---|---|
| JP | 2016-010283 A | 1/2016 |
| KR | 10-2017-0001437 A | 1/2017 |

\* cited by examiner

AIR CONDITIONER AND RECTIFIER

CROSS-REFERENCE TO RELATED APPLICATION

This application is based on and claims priority under 35 U.S.C. § 119 to Japanese Patent Applications No. 2017-212390, filed on Nov. 2, 2017 in the Japanese Intellectual Property Office, and Korean Patent Application No. 10-2018-0081550, filed on Jul. 13, 2018, in the Korean intellectual Property Office, the disclosures of which are incorporated by reference herein in their entireties.

BACKGROUND

1. Field

The present disclosure relates to an air conditioner and a rectifier.

2. Description of the Related Art

Recently, a rectifier (that is, a converter) for rectifying alternating current is connected to an inverter to generate alternating current that has a frequency different from a frequency of alternating current that is supplied to the rectifier and use the alternating current for driving a motor, etc. Such a motor is widely used in an air conditioning apparatus such as an air conditioner, a refrigerating apparatus such as a refrigerator, etc.

In a double voltage rectifier for rectifying alternating current and boosting an input alternating-current voltage to a double direct-current voltage, Power Factor Control (PFC) technology for effectively suppressing harmonic current, as well as boosting, is becoming important. Particularly, since a member for PFC has a large electrical and temperature load along with high power and high density of a rectifier, a double voltage rectifier for high-efficient PFC is required.

SUMMARY

Therefore, it is an aspect of the present disclosure to provide an air conditioner and a rectifier capable of suppressing harmonic current, while controlling an output voltage to a predetermined value.

Additional aspects of the disclosure will be set forth in part in the description which follows and, in part, may be obvious from the description, or may be learned by practice of the disclosure.

In accordance with an aspect of the present disclosure, there is provided an air conditioner including: a rectifier including a plurality of capacitors connected in series to each other, a switching device configured to control a flow of current supplied to the respective capacitors to charge or discharge the plurality of capacitors, a voltage detector configured to detect an output voltage of the plurality of capacitors, and a current detector configured to detect the current; and an inverter configured to generate alternating current by receiving an output voltage of the rectifier.

The air conditioner may further include a diode bridge connected in parallel to the switching device, wherein the current detector detects output current of the diode bridge.

The current detector may detect current of a power source for supplying a voltage to the rectifier.

The voltage detector may include a plurality of voltage detectors for detecting an output voltage of the plurality of capacitors.

The air conditioner may further include a controller configured to compare the output voltage detected by the voltage detector with a predetermined target voltage, and to control the switching device based on the result of the comparison.

The controller may calculate target current based on the result of the comparison, compares the target current with the result of the detection by the current detector, and control the switching device based on the result of the comparison between the target current and the result of the detection by the current detector.

The controller may calculate target current based on the result of the comparison, and control the switching device such that the current detected by the current detector has a waveform of the target current.

The controller may convert a waveform of the target current such that the target current satisfies a predetermined harmonic standard, and control the switching device such that the current detected by the current detector has the converted waveform of the target current.

The voltage detector may include a plurality of voltage detectors configured to detect output voltages of the plurality of capacitors, respectively, and the controller may compare output voltages of the plurality of capacitors with a plurality of predetermined target voltages, respectively, for the plurality of voltage detectors.

The switching device may include a plurality of switching devices configured to control flows of current that is supplied to the respective capacitors to charge the plurality of capacitors respectively.

The air conditioner may further include a controller configured to control the plurality of switching devices independently.

The controller may control a duty rate of the plurality of switching devices.

In accordance with another aspect of the present disclosure, there is provided an air conditioner including: a rectifier including a plurality of capacitors connected in series to each other and configured to supply a plurality of output voltages from both terminals of the plurality of capacitors and from a node between the plurality of capacitors, a plurality of switching devices configured to switch direct current rectified from supplied alternating current to charge the plurality of capacitors individually, a plurality of voltage sensors configured to detect the plurality of output voltages, respectively, and a current detector configured to detect the alternating current or the direct current; and an inverter configured to receive an output voltage from the rectifier and to generate alternating current.

The current detector may be installed at a side of a power source from which the alternating current is supplied, rather than a side of the plurality of voltage detectors.

The air conditioner may further include a controller configured to control the plurality of switching devices, based on the plurality of output voltages detected by the plurality of voltage detectors, the alternating current detected by the current detector, a plurality of target voltages decided for the plurality of output voltages, and target current set to correspond to a harmonic standard.

A target voltage may be set for each of the plurality of output voltages.

The target current may be a value obtained by adding an offset value to an absolute value of a sine wave having a frequency which is three times a supplied alternating current frequency, or an absolute value of a sine wave of the supplied alternating current frequency.

The controller may divide a unit period for repetition set to include at least one period of a waveform representing the target current into a plurality of segments, and control the switching device for each segment.

The controller may control the plurality of switching devices by using a value obtained by calculating a difference between the target current and current detected for a unit period immediately before the segment through an integral factor.

In accordance with an aspect of the present disclosure, there is provided a rectifier including: a plurality of capacitors connected in series to each other; a switching device configured to control a flow of current supplied to each capacitor to charge or discharge the plurality of capacitors; a voltage detector configured to detect an output voltage of the plurality of capacitors; and a current detector configured to detect the current.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document. Those of ordinary skill in the art should understand that in many, if not most instances, such definitions apply to prior, as well as future uses of such defined words and phrases.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
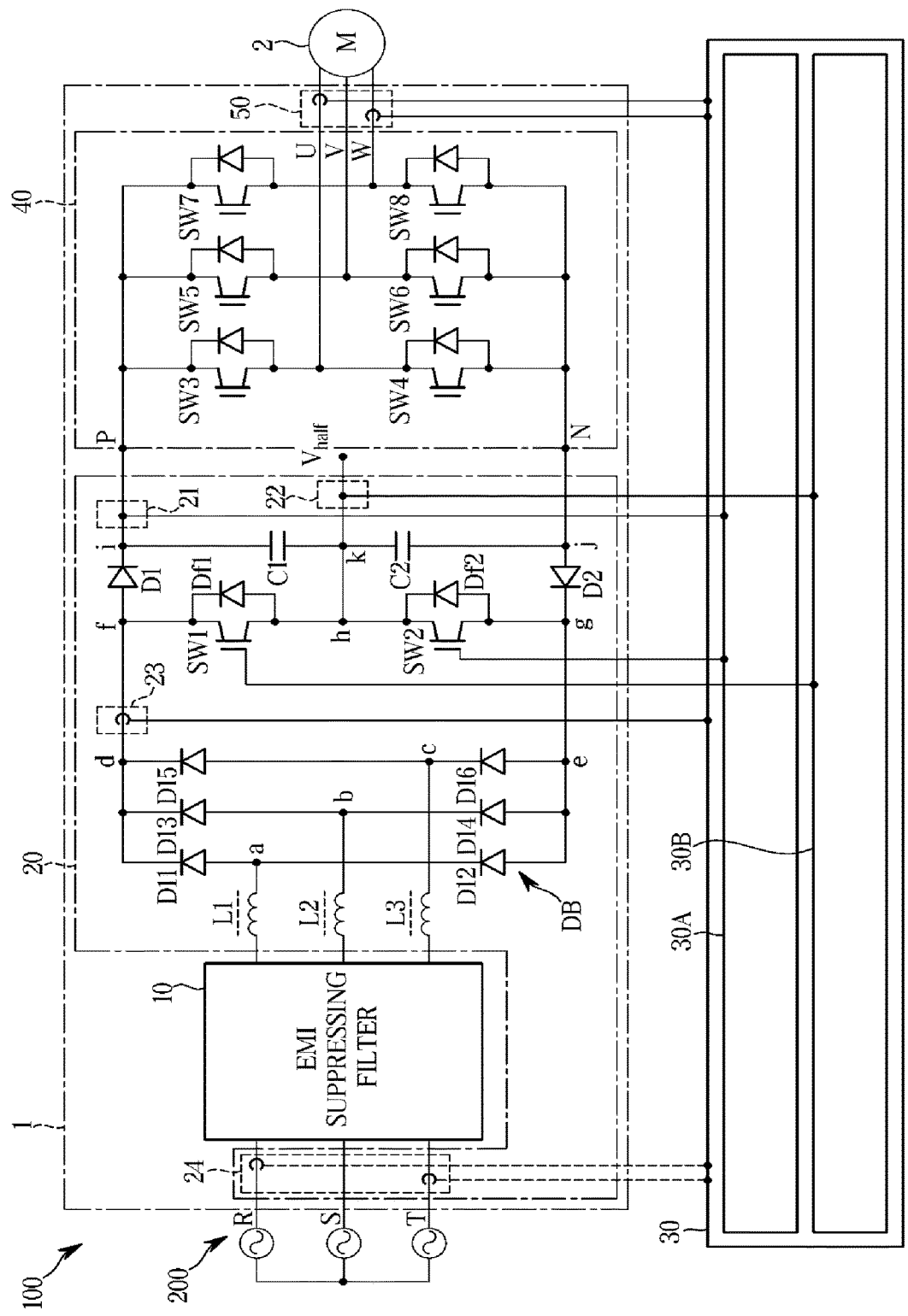
FIG. 1 illustrates a circuit diagram of an example of a motor apparatus.

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Configurations illustrated in the embodiments and the drawings described in the present specification are only embodiments of the present disclosure, and thus it is to be understood that various modified examples, which may replace the embodiments and the drawings described in the present specification, are possible when filing the present application.

Also, like reference numerals or symbols denoted in the drawings of the present specification represent members or components that perform the substantially same functions. Also, the terms used in the present specification are used to describe the embodiments of the present disclosure, not for the purpose of limiting the disclosure.

It is to be understood that the singular forms "a," "an," and "the" include plural referents unless the context clearly dictates otherwise. It will be understood that when the terms "includes," "comprises," "including," and/or "comprising," when used in this specification, specify the presence of stated features, figures, steps, components, or combination thereof, but do not preclude the presence or addition of one or more other features, figures, steps, components, members, or combinations thereof.

It will be understood that, although the terms "first", "second", etc., may be used herein to describe various elements, these elements should not be limited by these terms. The above terms are used only to distinguish one component from another. For example, a first component discussed below could be termed a second component, and similarly, a second component may be termed a first component without departing from the teachings of this disclosure. As used herein, the term "and/or" includes any and all combinations of one or more of the associated listed items.

Reference numerals used in operations are provided for convenience of description, without describing the order of the operations, and the operations can be executed in a different order from the stated order unless a specific order is definitely specified in the context.

Hereinafter, embodiments of the present disclosure will be described in detail with reference to the accompanying drawings.

In order to satisfy the International Electrotechnical Commission (IEC) standard (standard for harmonics) for harmonic current of a power source, a rectifier (converter) generally adopts a harmonic suppressing plan using passive components such as reactors, etc. However, when a reactor is applied to equipment using three-phase alternating current such as a large-sized air conditioner, a large-sized reactor is needed. Therefore, many disadvantages, such as loss or heating by the reactor, an increase in size of the equipment, etc., appear. Accordingly, current embodiments are to suppress harmonic current, while controlling an output voltage (DC link voltage) to a predetermined value. Also, there are various kinds of air conditioners including a refrigerator blower (fan) heat-exchanger, a humidifier, an air filter, and the like to adjust the temperature, humidity, cleanliness, and current of air. The refrigerator is driven by a compressor.

Also, recently, trials for suppressing the cost of a rectifier in response to various requirements, such as advancement in performance of devices, cost requirement from the market, etc. are being conducted. For example, when a rectifier used for three-phase alternating current uses a power source of 400V-series, the rectifier uses devices having a withstanding voltage of 1200 V. When the rectifier is applied to a large-sized air conditioner, and an output voltage (DC link voltage) for driving a compressor is used as a driving voltage of a fan, an inverter driving the fan also uses a device having a withstanding voltage of 1200 V. Since a voltage required for the fan is smaller than that required for the compressor, it may be preferable to achieve low cost by applying a device of a low withstanding voltage.

There are many cases in which two 1200V-series rectifiers connected in series to each other are used for the purpose of securing a withstanding voltage of an electrolytic capacitor for smoothing, and also, there are many cases in which a plurality of rectifiers are connected in parallel to each other. These are cases of dividing an output voltage (DC link voltage) with capacitors. A method of using a voltage divided by capacitors connected in series to each other to supply power to a load such as a fan can be considered. However, when power is supplied from one capacitor to a load such as a fan, voltage unbalance occurs between the capacitor and the other capacitor. As a result, the voltage of the capacitor becomes 0V, and the voltage of the other capacitor becomes an output voltage (DC link voltage). In this state, no power can be supplied to the load, and furthermore, the voltage exceeds the withstanding voltage of the capacitors.

Accordingly, a rectifier according to the present embodiment controls the voltages of capacitors connected in series to each other, individually, to thereby supply power to loads connected to the respective capacitors connected in series to each other, while controlling an output voltage (DC link voltage) to a predetermined value. That is, by using voltages divided by capacitors, it is possible to stably control the voltages of the capacitors even when loads are unbalanced. Therefore, loads using the divided voltages can use devices having low withstanding voltages.

Hereinafter, an embodiment of the present disclosure will be described in detail with reference to the accompanying drawings.

FIG. 1 illustrates a circuit diagram of an example of a motor apparatus 100.

In an embodiment, the motor apparatus 100 may include a power supply 1 and a motor 2. The motor apparatus 100 may be connected to a power source 200 of three-phase alternating current. The power source 200 may be an example of an alternating-current power source. The power supply 1 may be an example of a power supplying apparatus.

The power supply 1 may include an Electromagnetic Interference (EMI) suppressing filter 10 (hereinafter, referred to as an EMI suppressing filter 10) connected to the power source 200, a rectifier (converter) 20 connected to the EMI suppressing filter 10, a controller 30 connected to the rectifier 20 to control the rectifier 20, and an inverter 40 connected to the rectifier 20. Also, the power supply 1 may include a controller (not shown) for controlling the inverter 40. Also, the power supply 1 may include a current detector 50 for detecting current supplied from the power supply 1 to the motor 2.

The rectifier 20 may be an example of a rectifying apparatus. Also, the rectifying apparatus may include the EMI suppressing filter 10 in addition to the rectifier 20.

The motor 2 may be connected to the inverter 40. The motor 2 may be, for example, a DC brushless motor.

The current detector 50 may detect (measure) current (a current value) flowing through arbitrary two phases in three-phase (U phase, V phase, W phase) alternating current supplied to the motor 2 from the inverter 40. In FIG. 1, the current detector 50 may detect the U and W phases. In the case of three-phase alternating current, a sum of current values flowing through the three phases is zero, and accordingly, by detecting current of two phases (that is, measuring current values of two phases), current values of the three phases may be obtained.

Hereinafter, the operation will be described in order.

[EMI Suppressing Filter 10]

The EMI suppressing filter 10 may be a member for removing EMI, and may be, for example, a choke coil for preventing a high frequency from passing through noise.

[Rectifier 20]

The rectifier 20 may rectify three-phase alternating current supplied from the power source 200 to direct current. The rectifier 20 may include inductors L1, L2, and L3, a diode bridge DB, switching devices SW1 and SW2, diodes D1 and D2, feedback diodes Df1 and Df2, and capacitors C1 and C2. Also, the diode bridge DB may include diodes D11, D12, D13, D14, D15, and D16. Also, the rectifier 20 may include a current detector 23 for detecting current (output current) of the diode bridge DB. Also, the rectifier 20 may include a voltage detector 21 for detecting an output voltage of the rectifier 20, and a voltage detector 22 for detecting a voltage of the capacitor C2. Also, the rectifier 20 may include a current detector 24 for detecting current of the power source 200, instead of the current detector 23 or together with the current detector 23.

The diode bridge DB may be configured by connecting three groups each consisting of two diodes connected in series to each other in parallel. That is, the diode D11 ay be connected in series to the diode D12 at a node b, the diode D13 may be connected in series to the diode D14 at a node b, and the diode D15 may be connected in series to the diode D16 at a node c. Also, the diodes D11 to D16 may be connected in parallel to each other at nodes d and e. Also, the diodes D11 to D16 may be connected to cause current to flow from the node e toward the node d.

One terminals of the inductors L1, L2, and L3 may be respectively connected to R, S, and T phases of the power source 200 via the EMI suppressing filter 10. Also, the other terminal of the inductor L1 may be connected to the node a, the other terminal of the inductor L2 may be connected to the node b, and the other terminal of the inductor L3 may be connected to the node c.

The switching devices SW1 and SW2 may be connected in series to each other at a node h, the switching device SW1 may be connected to a node f connected to the node d, and the switching device SW2 may be connected to a node g connected to the node e. The feedback diodes Df1 and Df2 may be connected in parallel to the switching devices SW1 and SW2. The feedback diodes Df1 and Df2 may be connected to cause current to flow from the node g toward the node f. A direction in which current flows through the feedback diodes Df1 and Df2 may be opposite to a direction in which current flows through the switching devices SW1 and SW2. Also, the node d and node f may have the same potential. Also, the node e and the node g may have the same potential.

The switching devices SW1 and SW2 may be power switching devices of a high withstand voltage. The switching devices SW1 and SW2 may be, for example, field effect transistors or insulated gate bipolar transistors (IGBT). The switching devices SW1 and SW2 may be 3-terminal devices, and the terminals for controlling on/off are called gates.

One terminal (anode) of the diode D1 may be connected to the node f, and the other terminal (cathode) of the diode D1 may be connected to a node i. Also, one terminal (cathode) of the diode D2 may be connected to the node j, and the other terminal (anode) of the diode D2 may be connected to the node g.

The capacitors C1 and C2 may be connected in series to each other at a node k, wherein the capacitor C1 may be connected to the node i, and the capacitor C2 may be connected to the node j. Also, the node k between the capacitor C1 and the capacitor C2 may be connected to the node h between the switching device SW1 and the switching SW2. That is, the node h and the node k may have the same potential.

The rectifier 20 may obtain two voltages that are a potential (voltage) of the node i with respect to the node j and a potential (voltage) of the node k with respect to the node j. That is, the rectifier 20 may implement a multi-level boost converter. Also, the potential of the node k may be lower than the potential of the node i, and accordingly, the potential of the node k is called an intermediate potential $V_{half}$. The nodes i and k may be respectively connected to input terminals P and N of the inverter 40.

In this specification, the potential of the node i with respect to the node j is also referred to as an output potential (output voltage), and the potential of the node k with respect to the node j is also referred to as an intermediate potential (intermediate voltage).

Also, the node j of the rectifier 20 may have a reference potential. Also, the node i of the rectifier 20 is called a DC link. Accordingly, the potential (voltage) of the node i with respect to the potential of the node j is also referred to as a DC link voltage. That is, the DC link voltage may be a voltage obtained by adding a voltage (voltage between the node i and the node k) of the capacitor C1 to a voltage (voltage between the node k and the node j) of the capacitor C2. Also, the DC link voltage may be supplied as an output voltage of the rectifier 20 to the inverter 40.

The current detector 23 may be installed between the node d and the node f to detect (measure) current (output current) of the diode bridge DB. Since the current of the diode bridge DB is pulsating current to which three-phase alternating current is reflected, the current detector 23 may detect current of each phase of the three-phase alternating current from a waveform of the current.

The voltage detector 21 may be installed around the node i (more specifically, between the node i and the input terminal P of the inverter 40), and detect (measure) a voltage (that is, an output voltage (DC link voltage) of the rectifier 20) obtained by adding a voltage of the capacitor C1 to a voltage of the capacitor C2. Also, the voltage detector 22 may detect (measure) a voltage (that is, an intermediate potential $V_{half}$) of the capacitor C2.

The other current detector 24 included in the rectifier 20, instead of the current detector 23, may detect (measure) current passing through arbitrary two phases in three-phase alternating current (R phase, S phase, and T phase) supplied to the EMI suppressing filter 10 from the power source 200. In FIG. 1, the current detector 24 may detect the R phase and the T phase. In the case of three-phase alternating current, a sum of current values flowing through the three phases is zero, as described above, and accordingly, by detecting two phases (that is, measuring current values), current values of the three phases may be obtained.

The current detector 23 or the current detector 24 may be installed upstream toward the power source 200 supplying alternating current, rather than the voltage detectors 21 and 22.

Also, inductors may be installed between the node d and the node f and between the node e and the node g, respectively, instead of the inductors L1, L2, and L3.

[Controller 30]

The controller 30 may be implemented as a computer including a CPU, memory, etc. Also, the controller 30 may control on/off of the switching devices SW1 and SW2 of the rectifier 20, based on current detected by the current detector 23 (or the current detector 24) of the rectifier 20 and a voltage detected by the voltage detector 21 or 22. That is, the controller 30 may generate a Pulse Width Modulation (PWM) signal for controlling on/off of the switching devices SW1 and SW2, according to a program stored in the memory.

The controller 30 may include two control units 30A and 30B. The control units 30A and 30B may have the same configuration which will be described later. Also, as shown in FIG. 1, the control unit 30A may be connected to the voltage detector 21 for detecting the potential (DC link voltage) of the node i. Meanwhile, the control unit 30B may be connected to the voltage detector 22 for detecting the potential (intermediate potential $V_{half}$) of the node k. Also, a voltage (DC link voltage—intermediate potential $V_{half}$) resulting from subtracting the potential of the node k detected by the control unit 30B from the potential of the node i and applied to the capacitor C1 may be input to the control unit 30A. Also, a voltage resulting from subtracting the potential (reference potential) of the node j from the potential of the node k and applied to the capacitor C2 may be input to the control unit 30B. The voltages may be detected by various methods including a method of installing resistors between the node i and the node j and between the node k and the node j, respectively, and measuring values of voltages generated by current flowing through the resistors.

Also, the controller 30 may be connected to the current detector 23 for detecting (measuring) current flowing between the node d (an output of the diode bridge DB) and the node f (toward the switching device SW1). Also, the current (measured current value) detected by the current detector 23 may be input to the control units 30A and 30B. As described above, the current detector 24, instead of the current detector 23, may be used. Also, the current detector 23 or the current detector 24 may be connected to each of the control units 30A and 30B of the controller 30.

The current (current value) may be detected (measured) by a current sensor disposed on a path along which current flows. The current sensor may be a coil surrounding a path of current. Also, the current may be detected by various methods including a method of measuring a voltage induced to the coil.

Also, the control unit 30A may generate a PWM signal for controlling on/off of the switching device SW2, and supply the PWM signal to a gate of the switching device SW2. Meanwhile, the control unit 30B may generate a PWM signal for controlling on/off of the switching device SW1, and supply the PWM signal to a gate of the switching device SW1. That is, the control unit 30A may detect a voltage of the capacitor C1 to turn on/off the switching device SW2, and control the voltage of the capacitor C1. The control unit 30B may detect a voltage of the capacitor C2 to turn on/off the switching device SW1, and control the voltage of the capacitor C2.

Also, the control units 30A and 30B may be implemented as different computers (microcomputers) or as a single computer (microcomputer). Also, the control units 30A and 30B may be virtually implemented.

[Inverter 40]

The inverter 40 may switch direct current supplied from the 20 to generate alternating current for driving the motor 2 which is a load. The inverter 40 may generate three-phase alternating current (U phase, V phase, and W phase).

The inverter 40 may include a plurality of switching devices SW3 to SW8 and a plurality of feedback diodes connected in parallel to the respective switching devices SW3 to SW8. More specifically, three groups each including two switching devices connected in series to each other may be connected in parallel to each other. That is, the switching devices SW3 and SW4 may be connected in series to each other, the switching devices SW5 and SW6 may be connected in series to each other, and the switching devices SW7 and SW8 may be connected in series to each other. Also, the switching devices SW3 to SW8 may be connected in parallel between the input terminals P and N of the inverter 40. The switching devices SW3 to SW8 and the feedback diodes connected in parallel to the switching devices SW3 to SW8 may be connected in a direction in which current flows from the input terminal P to the input terminal N. A direction in which current flows through the feedback diodes may be opposite to a direction in which current flows through the switching devices SW3 to SW8.

A node between the switching device SW3 and the switching device SW4 may be the U phase, a node between the switching device SW5 and the switching device SW6 may be the V phase, and a node between the switching device SW7 and the switching device SW8 may be the W phase. The U, V, and W phases may be connected to the motor 2.

By the controller 30 for controlling the inverter 40, a PWM signal may be supplied to the gates of the switching devices SW3 to SW8. Accordingly, the inverter 40 may generate three-phase alternating current (U phase, V phase, and W phase).

[Operation of the Motor Apparatus 100]

Operations of the motor apparatus 100 will be described.

When alternating current is supplied from the power source 200 through the EMI suppressing filter 10, the rectifier 20 may rectify the alternating current to generate an output voltage (DC link voltage) of direct current between the node i and the node j. Since the rectifier 20 includes the switching devices SW1 and SW2 and the capacitors C1 and C2, the rectifier 20 may acquire an arbitrarily set voltage having a boosting rate of 1 or greater with respect to a voltage obtained when alternating current is rectified by the diode bridge DB. For example, when a line-to-line root mean square value of an alternating-current voltage supplied from the power source 200 is 380 Vrms, a peak value of a direct-current voltage obtained when the alternating-current voltage is rectified by the diode bridge DB may be ideally 537 V. Therefore, an output voltage (DC link voltage) of direct current obtained by the rectifier 20 may be an arbitrary set voltage of 537 V or higher.

The inverter 40 may generate three-phase alternating current (U phase, phase, and W phase) using an output voltage (DC link voltage) of direct current generated by the rectifier 20 by turning on/off the three groups of the switching devices SW3 to SW8 connected in series to each other. Also, the inverter 40 may supply the three-phase alternating current (U phase, V phase, and W phase) to the motor 2. Also, the three groups of the switching devices SW3 to SW8 may be the group of the switching devices SW3 and SW4, the group of the switching devices SW5 and SW6, and the group of the switching devices SW7 and SW8.

The motor 2 may rotate by the alternating current (U phase, V phase, and W phase) supplied from the inverter 40. The controller (not shown) for controlling the inverter 40 may change a frequency of alternating current (U phase, V phase, and W phase) supplied from the inverter 40 to thereby change the rpm of the motor 2.

Operations of the inverter 40 have been publicly known, and accordingly, a detailed description thereof will be omitted. Hereinafter, operations of the rectifier 20 included in the power supply 1 will be described in detail.

(Operation of the Rectifier 20)

Figure 2:
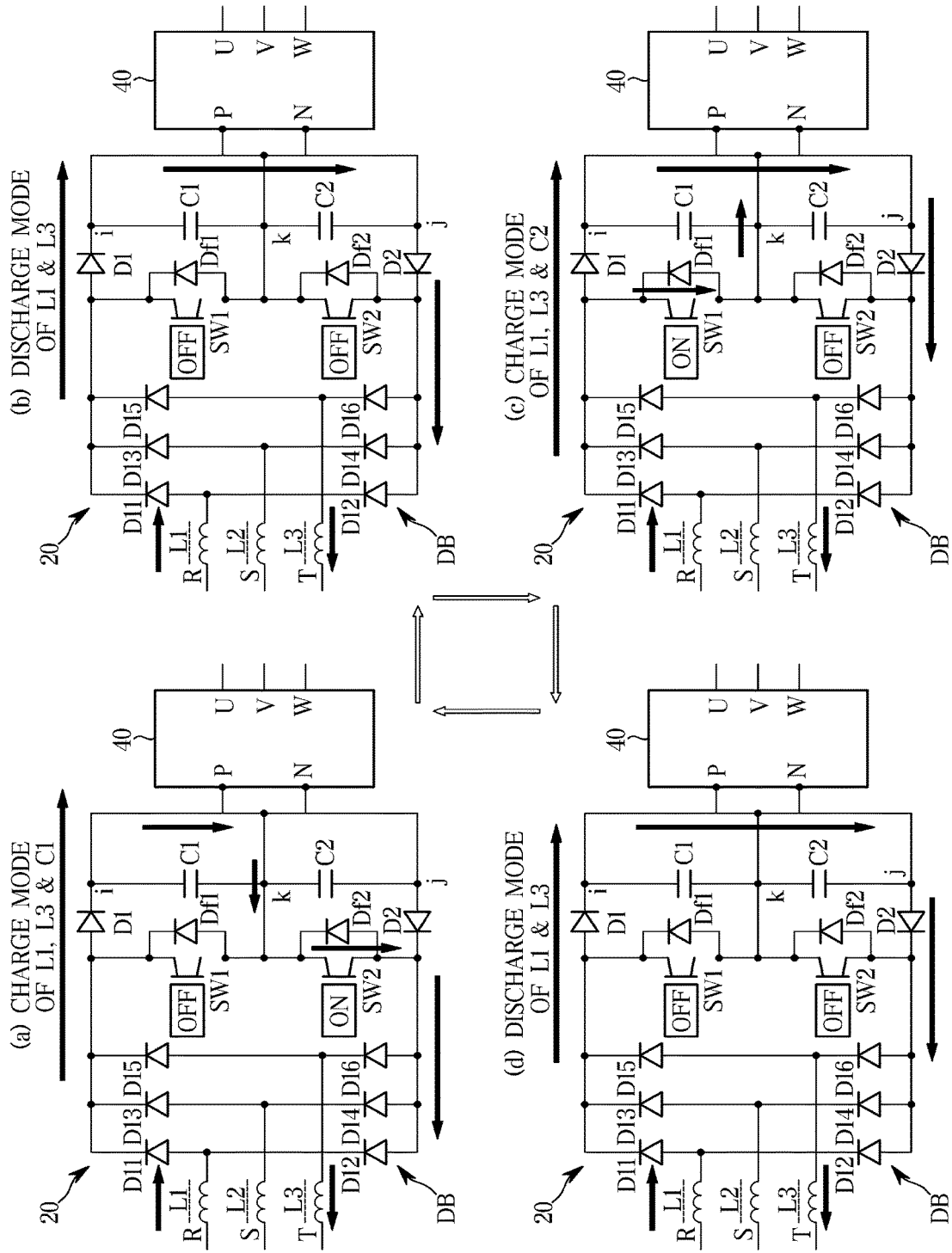
FIG. 2 illustrates a view for describing basic operations of a rectifier in a power source, wherein (a) shows a charge mode of inductors and a capacitor, (b) shows a discharge mode of the inductors, (c) shows a charge mode of the inductors and a capacitor, and (d) shows a discharge mode of the inductors.

FIG. 2 illustrates a view for describing basic operations of the rectifier 20 in the power supply 1, wherein (a) shows a charge mode of the inductors L1 and L3 and the capacitor C1, (b) shows a discharge mode of the inductors L1 and L3, (c) shows a charge mode of the inductors L1 and L3 and the capacitor C2, and (d) shows a discharge mode of the inductors L1 and L3. (a) to (d) of FIG. 2 relate to cases in which the potential of a R phase is higher than the potential of a T phase. Hereinafter, the modes will be described in order.

A voltage resulting from adding a voltage (a voltage between the node i and the node k) of the capacitor C1 to a voltage (a voltage between the node k and the node j) of the capacitor C2 may be applied to the inverter 40.

Charge Mode of the Inductors L1 and L3 and the capacitor C1.

In a charge mode of the inductors L1 and L3 and the capacitor C1 as shown in (a) of FIG. 2, the switching device SW1 may be turned off and the switching device SW2 may be turned on, by the controller 30 (see FIG. 1). In this case, current supplied from the R phase of the power source 200 (see FIG. 1) may flow along a path of passing through the inductor L1, the diode D11, the diode D1, the capacitor C1, the switching device SW2, the diode D16, and the inductor L3 in this order and then returning to the T phase of the power source 200. At this time, electron energy may be accumulated in the inductors L1 and L3, and simultaneously, the capacitor C1 may be charged. Charges from a direct-current voltage obtained by rectifying an alternating current voltage of the power source 200 through the diode bridge DB may be supplied to the capacitor C1 for a time (on-duty time) in which the switching device SW2 is in a turned-on state. Also, the on-duty time may be a time for which the switching device SW2 is in a turned-on state when the switching device SW2 is repeatedly turned on and off. That is, the voltage control of the capacitor C1 may be possible by a time for which the switching device SW2 is in a turned-on state.

Since the diode D2 is connected in a direction that is opposite to the path along which the current flows, the capacitor C2 may be not discharged.

Discharge Mode of the Inductors L1 and L3.

In a discharge mode of the inductors L1 and L3 as shown in (b) of FIG. 2, the switching device SW2 which is in a turned-on state may be turned off by the controller 30. That is, both the switching devices SW1 and SW2 may be turned off. Since the switching device SW2 changes from a turned-on state to a turned-off state, a current path passing through the switching device SW2 may be blocked. Accordingly, current supplied from the R phase of the power source 200 may flow along a path of passing through the inductor L1, the diode D1, the capacitors C1 and C2, the diode D2, the diode D16, and the inductor L3 in this order and then returning to the T phase of the power source 200, so that electron energy accumulated in the inductors L1 and L3 may be emitted (discharged). Therefore, the capacitors C1 and C2 connected in series to each other may be further charged. According to inductance values of the inductors L1 and L3, a voltage (a voltage between the node i and the node j) of the capacitors C1 and C2 connected in series to each other may rise.

(c) Charge Mode of the inductors L1 and L3 and the Capacitor C2.

In a charge mode of the inductors L1 and L3 and the capacitor C2 as shown in (c) of FIG. 2, the switching device SW1 which is in a turned-off state may be turned on by the controller 30. That is, the switching device SW1 may be in a turned-on state, and the switching device SW2 may be in a turned-off state. Then, current supplied from the R phase of the power source 200 may flow along a path of passing through the inductor L1, the diode D11, the switching device SW1, the capacitor C2, the diode D2, the diode D16, and the inductor L3 in this order and then returning to the T phase of the power source 200. At this time, electron energy may be accumulated in the inductors L1 and L3, and simultaneously, the capacitor C2 may be charged. Charges from a direct-current voltage obtained by rectifying an alternating current voltage of the power source 200 through the diode bridge DB may be supplied to the capacitor C2 for a time (on-duty time) which the switching device SW1 is in a turned-on state. That is, the voltage control of the capacitor C2 may be possible by a time for which the switching device SW2 is in a turned-on state.

In this way, since voltage control is possible through the capacitors C1 and C2, the voltages of the capacitors C1 and C2 may be controlled to an arbitrarily set voltage, and also the voltage (DC link voltage) between the node i and the node j may be controlled to a voltage having a boosting rate of 1 or greater.

(d) Discharge Mode of the Inductors L1 and L3

In a discharge mode of the inductor L1 as shown in (d) of FIG. 2, the switching device SW1 which is in a turned-on state may be turned off by the controller 30. That is, both the switching devices SW1 and SW2 may be turned off. Since the switching device SW1 changes from a turned-on state to a turned-off state, a current path passing through the switching device SW1 may be blocked. Accordingly, current supplied from the R phase of the power source 200 may flow along a path of passing through the inductor L1, the diode D1, the capacitors C1 and C2, the diode D2, the diode D16, and the inductor L3 in this order and then returning to the T phase of the power source 200, so that electron energy accumulated in the inductors L1 and L3 may be emitted (discharged). Therefore, the capacitors C1 and C2 connected in series to each other may be further charged. According to inductance values of the inductors L1 and L3, a voltage (a voltage between the node i and the node j) of the capacitors C1 and C2 connected in series to each other may rise.

The above description relates to a case in which the potential of the R phase is higher than the potential of the T phase. However, the above description may also be applied in the same manner to cases in which the potentials of the three phases (R phase, S phase, and T phase) are set to different levels, and accordingly, descriptions thereof will be omitted.

As described above, the rectifier 20 may control a time (on-duty time) for which the switching devices SW1 and SW2 are turned on, thereby controlling the voltages of the capacitors C1 and C2. Accordingly, when loads are respectively connected to the capacitors C1 and C2, a stable voltage may be maintained although voltage unbalance occurs between the capacitors C1 and C2. A sum (a voltage between the node i and the node j) of a voltage of the capacitor C1 and a voltage of the capacitor C2 may become an output voltage (DC link voltage) of the rectifier 20, and also become an input voltage (a voltage between the input terminals P and N) of the inverter 40.

In the current embodiment, the inductors L1, L2, and L3 may be included. The inductors L1, L2, and L3 may charge electron energy when any one of the switching devices SW1 and SW2 is in a turned-on state, and emit (discharge) the accumulated electron energy to charge the capacitors C1 and C2 when both the switching devices SW1 and SW2 are in a turned-off state. That is, when a load is extremely small although an output voltage (DC link voltage) of the rectifier 20 is influenced by power supplied to the load, by controlling a turned-on time of the switching device SW1 or SW2, the output voltage (DC link voltage) of the rectifier 20 may be easily boosted to more than double a peak value of an alternating-current voltage of the power source 200 since the output voltage (DC link voltage) of the rectifier 20 is a sum (a voltage between the node i and the node j) of a voltage of the capacitor C1 and a voltage of the capacitor C2, although it also depends on the inductance values of the inductors L1, L2, and L3. For example, when a peak value of a direct-current voltage obtained by rectifying an alternating-current voltage through the diode bridge DB is 537V (380V*$\sqrt{2}$), wherein * represents multiplication, and a target value of the output voltage (DC link voltage) of the rectifier 20 is 600V, the peak value of 537V may be supplied to the capacitors C1 and C2 for a turned-on time of the switching devices SW1 and SW2 so that the voltages of the capacitors C1 and C2 become maximally 537V. Accordingly, supplying energy from the inductors L1, L2, and L3 may be principally unnecessary.

As a method of providing the rectifier 20 with a boosting function, there may be a method of using a single capacitor instead of the two capacitors C1 and C2 and raising a voltage with an inductor. In this method, an amount of energy required for raising an output voltage higher than a peak voltage of a direct-current voltage obtained by rectifying an alternating-current voltage through the diode bridge DB may be supplied from the inductor. For example, when a peak value of a direct-current voltage rectified by the diode bridge DB is 537V (380V*$\sqrt{2}$), and a target value of an output voltage (DC link voltage) from the rectifier 20 is 600V the inductor may need to supply an amount of energy required for raising the output voltage to 537V or higher. Accordingly, in the method in which a single capacitor is used, the inductor needs to supply a larger amount of energy than the case in which the two capacitors C1 and C2 are used. That is, in the method in which the single capacitor is used, an inductor having a great inductance value, that is, a large-sized inductor needs to be used.

As described above, in the motor apparatus 100 in an embodiment, inductors having small inductance values may be used as the inductors L1, L2, and L3 of the rectifier 20, which leads to miniaturization of the motor apparatus 100.

Also, voltages applied to both ends of the switching devices SW1 and SW2 may be equal to voltages divided by the capacitors C1 and C2. Accordingly, when the power source 200 of 400V series is used, ½ of a DC link voltage (a voltage between the node i and the node j) may be applied to the switching devices SW1 and SW2. Accordingly, when a target value of an output voltage (DC link voltage) is maximally 1000V, it may be sufficient if the switching devices SW1 and SW2 have a withstanding voltage of 500V or higher. That is, switching devices having a withstanding voltage of 600V may be used.

Meanwhile, when a single switching device is used, 1000V may be applied to the switching device. In this case, a switching device having a withstanding voltage of 1200V may need to be used. Since a switching device of a lower withstanding voltage has higher speed, the method using the two capacitors C1 and C2 in an embodiment may also have an advantage of high speed.

Hereinafter, operations of the controller 30 for controlling the rectifier 20 in the power supply 1 will be described in detail.

(Operations of the Controller 30)

Figure 3:
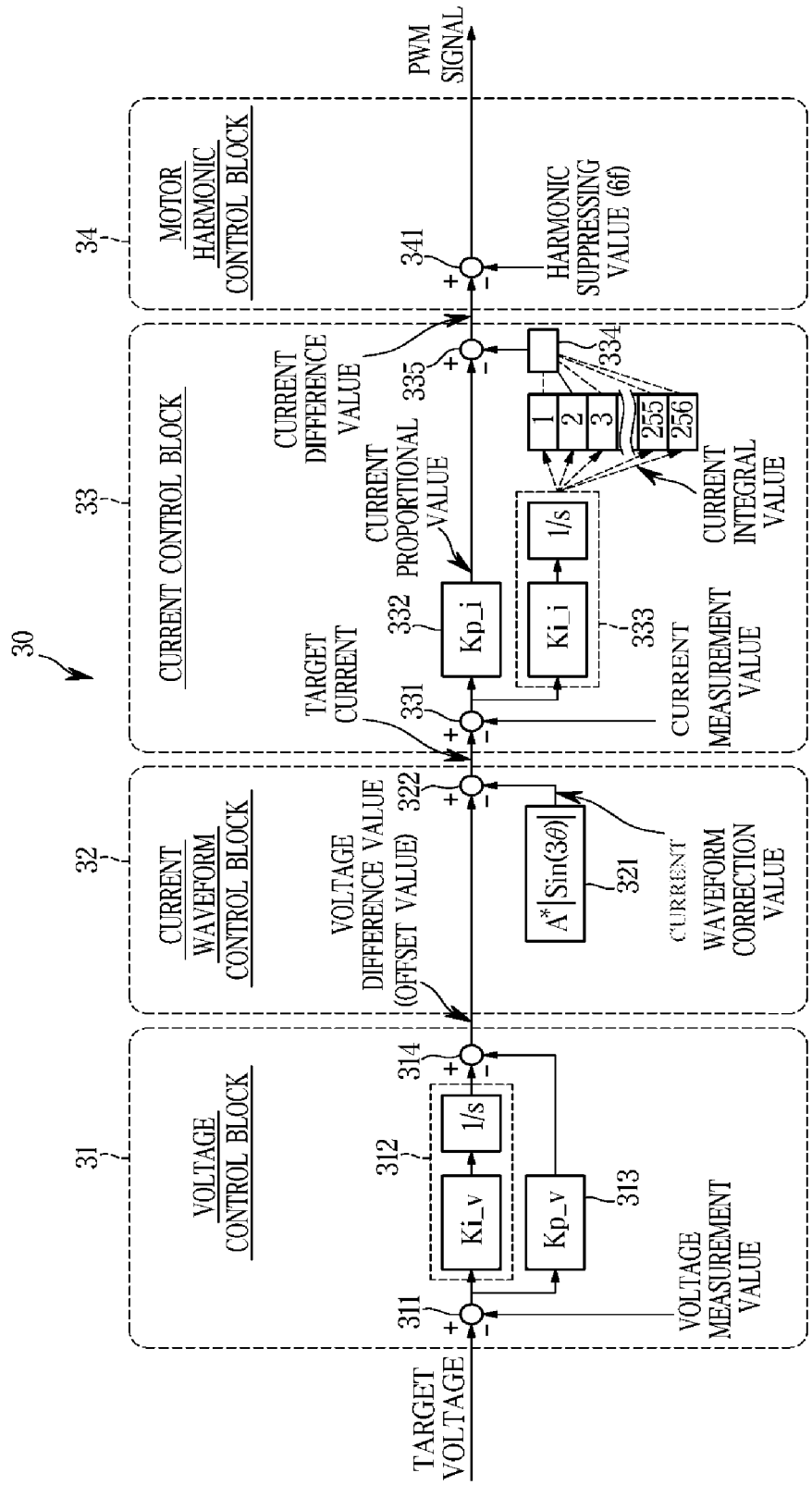
FIG. 3 illustrates a block diagram of a controller in a power source.

FIG. 3 illustrates a block diagram of the controller 30 in the power supply 1. Also, as described above, the controller 30 may include two control units (control units 30A and 30B). The block diagram shown in FIG. 3 shows the control unit 30A of the two control units 30A and 30B. The control unit 30B may be represented by the same block diagram as the control unit 30A, except for a part which will be described below. Accordingly, descriptions about the control unit 30B will be omitted.

The control unit 30A may include a voltage control block 31 for controlling an output voltage of direct current output from the rectifier 20, a current-waveform control block 32 for controlling a current waveform in order to control harmonics generated in current, a current control block 33 for controlling current, and a motor harmonic control block 34 for controlling harmonics generated in the motor 2. Also, the motor harmonic control block 34 may be used to control the motor 2. Accordingly, when the motor 2 is not controlled, the motor harmonic control block 34 may be not needed. Hereinafter, the components will be described in order.

As described above, the control unit 30A may detect a voltage of the node i of the rectifier 20, control a duty rate of a PWM signal for setting on/off of the switching device SW2 to control a voltage (a voltage between the node i and the node k) of the capacitor C1 to a predetermined voltage, and also control harmonics appearing in current to satisfy the EEC standard. Also, the duty rate is a ratio of On to a predetermined period for which On and Off are repeated.

(Voltage Control Block 31)

The voltage control block 31 may output a voltage difference value as an amount of control for controlling a voltage of the capacitor C1. The voltage control block 31 may include a comparator 311, an integral factor (integrator) 312, a proportional factor (proportioner) 313, and an adder 314. A target voltage decided for the capacitor C1 and a voltage (measured voltage value) of the capacitor C1 detected (measured) by the voltage detector 21 (see FIG. 1) may be input to the comparator 311. Then, the comparator 311 may calculate a difference (deviation) between the target voltage and the measured voltage value. The integral factor 312 may be a factor represented by a transfer function Ki_V*1/s and perform integral operation on the difference obtained by the comparator 311. The proportional factor 313 may be a factor represented by a transfer function Kp_V and perform proportional operation on the difference obtained by the comparator 311. Also, the adder 314 may add the result of the integral operation performed by the integral factor 312 to the result of the proportional operation performed by the proportional factor 313, and outputs a voltage difference value as a control value to be controlled.

That is, the voltage control block 31 may perform Proportional-Integral (PI) control for controlling the voltage of the capacitor C1 to a predetermined voltage.

The voltage control block 31 may control the voltage difference value to cause the voltage of the capacitor C1 to reach the target voltage although the voltage (DC link voltage) of the capacitor C1 drops by the magnitude of output power. Accordingly, the voltage difference value may depend on the output power. Also, the voltage (DC link voltage) of the capacitor C1 may be controlled to maximize the efficiency of the motor 2. Accordingly, when a high voltage is required with low output power, the voltage control block 31 may set a voltage difference value according to the output power, thereby improving the control efficiency of the motor 2.

Also, in the control unit 30B, a target voltage decided for the capacitor C2, instead of the capacitor C1, and a voltage (measured voltage value) of the capacitor C2 detected (measured) by the voltage detector 21 (see FIG. 1) may be input to the comparator 311.

By setting a target voltage to different values through the control units 30A and 30B, it may be possible to control a voltage $V_{half}$ divided by the capacitors C1 and C2, while controlling the DC link voltage. Therefore, it may be possible to supply power to a load from the node k (dividing point) between the capacitors C1 and C2.

(Current-Waveform Control Block 32)

The current-waveform control block 32 may control a current waveform in order to cause harmonics appearing in a current waveform to satisfy the IEC standard. The IEC standard limits Total Harmonic Distortion (THD) or Partial Weighted Harmonic Distortion (PWHD) to a predetermined value or smaller.

The current-waveform control block 32 may include a current-waveform setting factor 321 and an adder 322. The current-waveform setting factor 321 may output, when the power source 200 is three-phase alternating current, a current-waveform correction value which is calculated by a factor represented by a transfer function of the absolute value $(A*|\sin(3\theta)|)$ of a frequency component which is three times the three-phase alternating current. Also, the current-waveform setting factor 321 may function as a proportioner. Herein, $\theta$ is an angle representing a time of an alternating-current voltage, wherein $\theta=2\pi$ corresponding to one period. The adder 322 may add the current-waveform correction value to the voltage difference value obtained by the voltage control block 31 to output target current. The voltage difference value may be an offset value with respect to current. That is, the target current may be represented as an offset value with respect to $(A*|\sin(3\theta)|)$+current. The current-waveform correction value may be used to set a current waveform, and the offset value with respect to current may be used to set (bias) a magnitude of current by the voltage difference value obtained by the voltage control block 31. In this specification, a mean value of the target current represented by the offset value with respect to $(A*|\sin(3\theta)|)$+current is referred to as a magnitude of target current. In FIG. 3, the offset value with respect to current is denoted as an offset value.

Also, the amplitude A may be a parameter for setting the amplitude of the current waveform, and may change. That is, as current increases, the amplitude A may need to be set to a greater value in order to satisfy the IEC standard. Accordingly, amplitude A may change depending on a voltage difference value. The amplitude A may be calculated from a voltage value (target voltage) to be supplied to a load, or may be obtained by referring to a table provided for a voltage value to be supplied to a load.

That is, the controller 30 may change the amplitude A depending on a voltage difference value (offset value with respect to current). In other words, the controller 30 may change a magnitude of target current. Accordingly, the controller 30 may correct a small phase deviation, etc. of a current waveform with respect to an alternating-current voltage waveform.

As described above, the current-waveform control block 32 may output target current for setting a current waveform such that harmonics appearing in the current waveform satisfy a predetermined standard. Also, the current-waveform control block 32 may convert a voltage difference value for controlling an input voltage to target current for controlling current. The predetermined harmonic standard may have been set in advance in the manufacturing process, or may be a value input by a user.

The current-waveform setting factor 321 may use a transfer function of the absolute value $(A*|\sin(3\theta)|)$ of a frequency component which is three times three-phase alternating current, with respect to the voltage difference value obtained by the voltage control block 31. However, this is an example, and it may be sufficient if the current-waveform setting factor 321 outputs a current-waveform correction value for correcting a current waveform such that harmonics appearing in the current satisfy the standard. The current-waveform setting factor 321 may set a waveform such that harmonics appearing in current satisfy the standard, and output a current-waveform correction value for forming the waveform. Harmonics may be applied to satisfy the IEC standard. Accordingly, the current-waveform correction value may be calculated using a function representing a current waveform as described above, or may be obtained by a table for setting a predetermined current waveform. The current-waveform correction value and the target current will be described in detail, later.

(Current Control Block 33)

The current control block 33 may output a current difference value as an amount of control for controlling current flowing through the rectifier 20. The current control block 33 may include a comparator 331, a proportional factor (proportioner) 332, an integral factor (integrator) 333, memory 334, and an adder 335. The target current output from the current-waveform control block 32, and a current value detected (measured) by the current detector 23 may be input to the comparator 331. Then, the comparator 331 may calculate a difference between the target current and the measured current value. The proportional factor 332 may be a factor represented by a transfer function Kp_i, and perform proportional operation on the difference obtained by the comparator 331. The integral factor 333 may be a factor represented by the transfer function Ki_i*1/s, and perform integral operation on the difference obtained by the comparator 331. Also, the memory 334 may accumulate the result of integral operation for each timing (hereinafter, referred to as a segment) at which the power source 200 supplies an alternating-current voltage, and output the result of integral operation of the next segment accumulated in advance for the next timing (next segment). The adder 335 may add the result of the proportional operation by the proportional factor 332 to the result of the integral operation output from the memory 334, and output a current difference value as a control value to be controlled. That is, PI control may be performed for each segment. The segment will be described later.

Also, the memory 334 may be implemented as memory included in the controller 30.

Also, in the control unit 30B, a current value detected (measured) by the current detector 23 may be input to the comparator 331.

The measured current value may be a current value detected by the current detector 24, instead of the current detector 23, as described above.

(Motor Harmonic Control Block 34)

The motor 2 may easily generate harmonics 6f which is 6 times a frequency f of an electrical angle representing a change in magnetic field, and the harmonics 6f may flow to the power supply 1. Current may be detected by the current detector 23 (see FIG. 1) installed around the power source 200 rather than the capacitors C1 and C2. Accordingly, the detected current may include, as disturbance, harmonics 6f having a period which is different from the period of an alternating-current voltage of the power source 200. Accordingly, the motor harmonic control block 34 may be provided to suppress the 6-times harmonics 6f generated from the motor 2. In this way, the current control block 33 may generate a current waveform having stable periodicity. Therefore, the control stability of the current control block 33 may be improved.

The motor harmonic control block 34 may include a comparator 341. The comparator 341 may output a difference between a current difference value output from the current control block 33 and a correction value (harmonic suppressing correction value) for suppressing the 6-times harmonics 6f. Also, the frequency of the harmonics 6f of the motor 2 may be acquired by detecting current toward the motor 2. Accordingly, the harmonic suppressing correction value may be set, based on the frequency of the harmonics 6f of the motor 2, detected (measured) by the current detector 50. Also, the motor harmonic control block 34 may generate a PWM signal as an amount of control for controlling on/off of the switching device SW2. In other words, the amount of control may be a duty rate of a PWM signal for turning on/off the switching device SW2.

Also, the control unit 30A may include none of the voltage control block 31, the current-waveform control block 32, the current control block 33, and the motor harmonic control block 34. When the control unit 30A does not include the motor harmonic control block 34, the control unit 30A may use a current difference value output from the current control block 33 as a PWM signal for controlling on/off of the switching device SW2. Also, when the control unit 30A does not include the current-waveform control block 32, the control unit 30A may input a voltage difference value output from the voltage control block 31 as target current to the current control block 33.

The control unit 30B may also perform the same operations as the control unit 30A.

{Operations of the Memory 334 in the Current Control Block 33}

Hereinafter, operations of the memory 334 in the current control block 33 will be described in detail.

The current control block 33 may perform Power Factor Control (PFC). The PFC is to control a current waveform according to a waveform (alternating current phase voltage waveform) of an alternating current phase voltage. That is, the current control block 33 may need to set a current waveform of a phase adjusted according to an alternating current phase voltage waveform.

Figure 4:
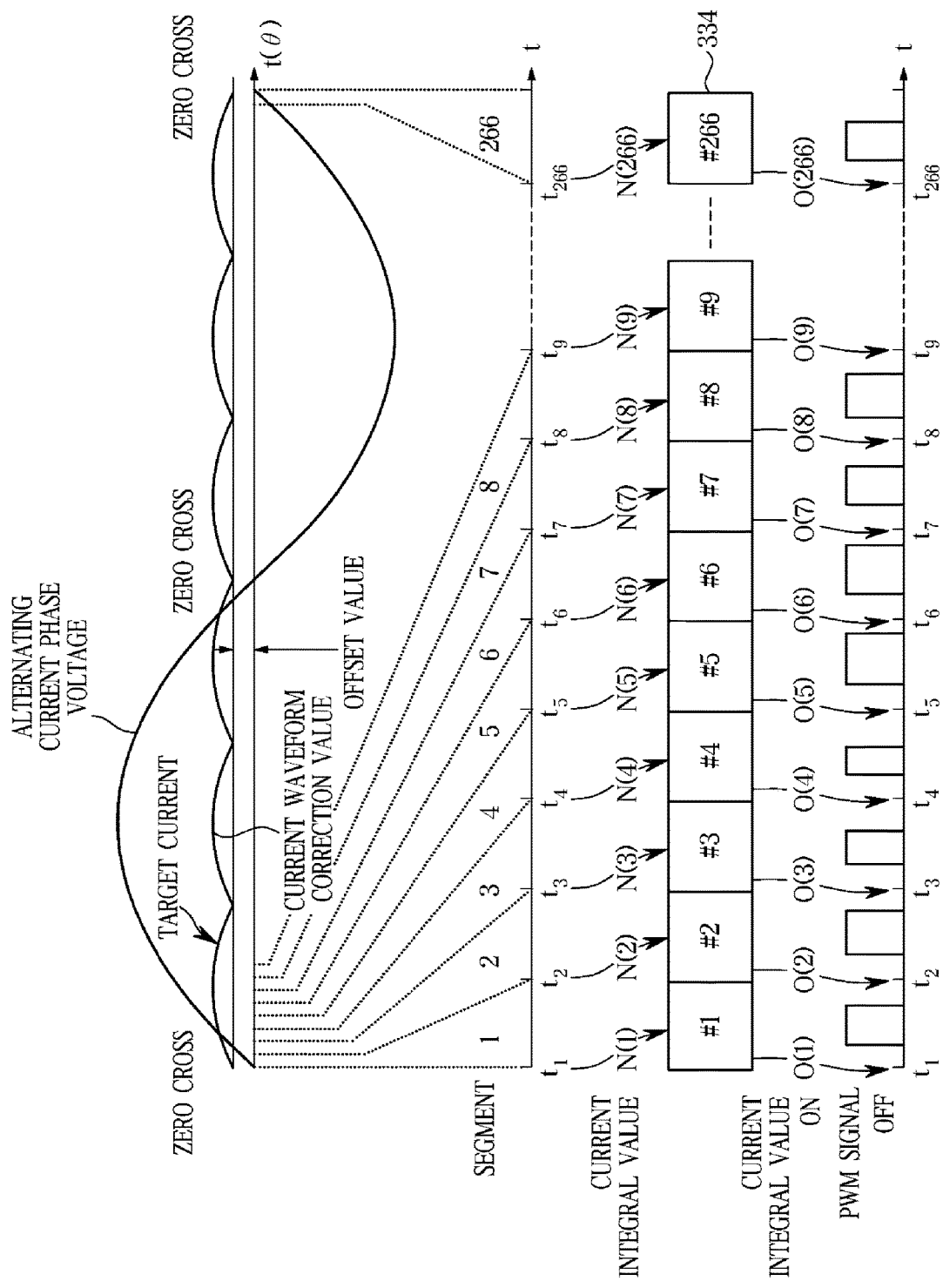
FIG. 4 illustrates a view for describing operations of memory in a current control block.

FIG. 4 illustrates a view for describing operations of the memory 334 in the current control block 33. FIG. 4 shows one period of 1 phase (alternating current phase voltage waveform) in a three-phase alternating current voltage waveform of the power source 200. Also, FIG. 4 shows target current output from the current waveform control block 32, wherein the target current is an offset value with respect to current waveform correction value (A*|sin(3θ)|)+ current. The offset value with respect to current may less vary than the current waveform correction value. Accordingly, the target current may have periodicity of the current waveform correction value. Also, in the lower part of FIG. 4, a part of a PWM signal which a part of the memory 334 and the motor harmonic control block 34 output to the gate of the switching device SW2 is shown.

The target current may have the periodicity of a frequency which is 3 times an alternating-current voltage of the power source 200, and the phase of the target current may match with the phase of the alternating current phase voltage waveform (in FIG. 4, denoted as an alternating current phase voltage). That is, a time at which the target current is zero may be identical to a time (zero cross) at which the alternating current phase voltage waveform is 0V.

In FIG. 4, as an example, one period (phase) of an alternating current phase voltage waveform may be set to a unit period for repetition, and one unit period may be divided to 266 segments. That is, one period of an alternating current phase voltage waveform may be divided to 266 segments, and for each segment, a PWM signal for controlling the switching device SW2 may be set. Also, the memory 334 may have 266 memory areas. The segments are respectively denoted by segments 1 to 266, and start times of the segments 1 to 266 are respectively denoted by times t1 to t266. Also, the memory areas are respectively denoted by memory areas #1 to #266. Also, one period (one period of a current waveform correction value and ⅓ of one period of an alternating current phase voltage in FIG. 4) of current having periodicity may be set to a unit period. That is, the unit period may be set to include at least one period of a waveform representing target current.

Hereinafter, FIG. 4 will be described with reference to FIG. 3.

At the time t1, a current measurement value measured actually may be input to the comparator 331. Then, the integral factor 333 may integrate a difference (error) between the current measurement value and target current output from the comparator 331 using a transfer function Ki_i1/s to obtain a current integral value N(1) for the time t1. The integral factor 333 may accumulate the current integral value N(1) in the memory area #1 of the memory 334. Meanwhile, the memory 334 may output a current integral value 0(2) accumulated in advance in the memory area #2 to the adder 335. Then, the adder 335 may output a current difference value of the segment 2 starting from the time t2, based on the current integral value 0(2). The current difference value may be converted to a PWM signal by the motor harmonic control block 34 and output. Also, a current integral value newly operated by a current measurement value measured at a time tx (x is an integer of 1 to 266) is referred to as a current integral value N(x), and a current integral value accumulated in advance in the memory 334 at the time tx is referred to as a current integral value 0(x).

The current integral value 0(2) accumulated in the memory 334 may correspond to a current integral value accumulated one unit period (one period of the alternating current phase voltage waveform) earlier than the time t2. The reason of using a current integral value 0(x) accumulated one unit period earlier than a time tx will be described below in regard of a case of x=1.

It may be ideal to calculate a current integral value that is applied to the segment 1 based on a current measurement value measured actually at the time t1, and to apply the current integral value to the segment 1. However, it may take a time for the controller 30 to calculate a current integral value. Therefore, it is apprehended that a timing at which a current integral value for the segment 1 is calculated and output by the controller 30 is too late to apply the current integral value to the segment 1. When the current integral value that is to be applied to the segment 1 is applied to another segment such as the segment 2 except for the segment 1, phase mismatch may occur between the alternating current phase voltage waveform and the current waveform. In the current embodiment, target current is set to include a frequency component (A*|sin(3θ)|) which is three times three-phase alternating current. Therefore, as shown in FIG. 4, current may change greatly. When a current integral value that is to be applied to the segment 1 is applied to another segment such as the segment 2 except for the segment 1, phase mismatch may occur between the alternating current phase voltage waveform and the current waveform, thereby failing to satisfy the IEC standard. That is, it may be necessary to reduce phase mismatch between the alternating current voltage waveform and the current waveform.

Accordingly, in an embodiment, a current integral value calculated based on an actually measured current measurement value may be accumulated in the memory 334, and a current integral value accumulated in the memory 334 before one unit period (herein, one period of an alternating current phase voltage waveform) may be used to calculate a current difference value. The reason is because although there is a difference between current measurement values for adjacent unit periods, it is easy to satisfy the IEC standard compared to the case in which phase mismatch occurs.

That is, a current integral value N(x) may be calculated from a current measurement value measured at a time tx, and stored in the memory #x, and a current integral value 0(x−1) measured before one unit period and stored in the memory area #(x+1) may be output to calculate target current that is to be applied to a segment x+1 from a time tx+1. As such, in a memory area #x of the memory 334, after the accumulated current integral value 0(x) is output, a new current integral value N(x) may be accumulated.

For example, one period (phase) of an alternating current phase voltage may be used as one unit period, and one unit period may be divided to 266 segments. However, the number of segments may be more than 266. That is, a current integral value that is calculated by the integral factor 333 may be a value before one unit period. However, as shown in the current control block 33 of FIG. 3, a current proportional value calculated by the proportional factor 332 may include no memory. A value of a segment in which current is actually measured may be used in the next segment. Therefore, a current difference value may become a sum of a current integral value before one unit time and a current proportional value before one period. That is, since the current proportional value includes an error corresponding to one segment, the accuracy of the current difference value may be further improved as a larger number of segments are used. Also, the number of the segments may be decided according to the accuracy and computing ability of the controller 30.

As described above in the case of a current waveform having periodicity, an actual current waveform may be controlled with a waveform set to target current. According to the method, it may be possible to suppress harmonics without having to perform operation of a high computational load such as Fast Fourier Transform (FFT). Accordingly, a program for executing the algorithm may be installed in a low-cost microcomputer having low computing ability.

Figure 5:
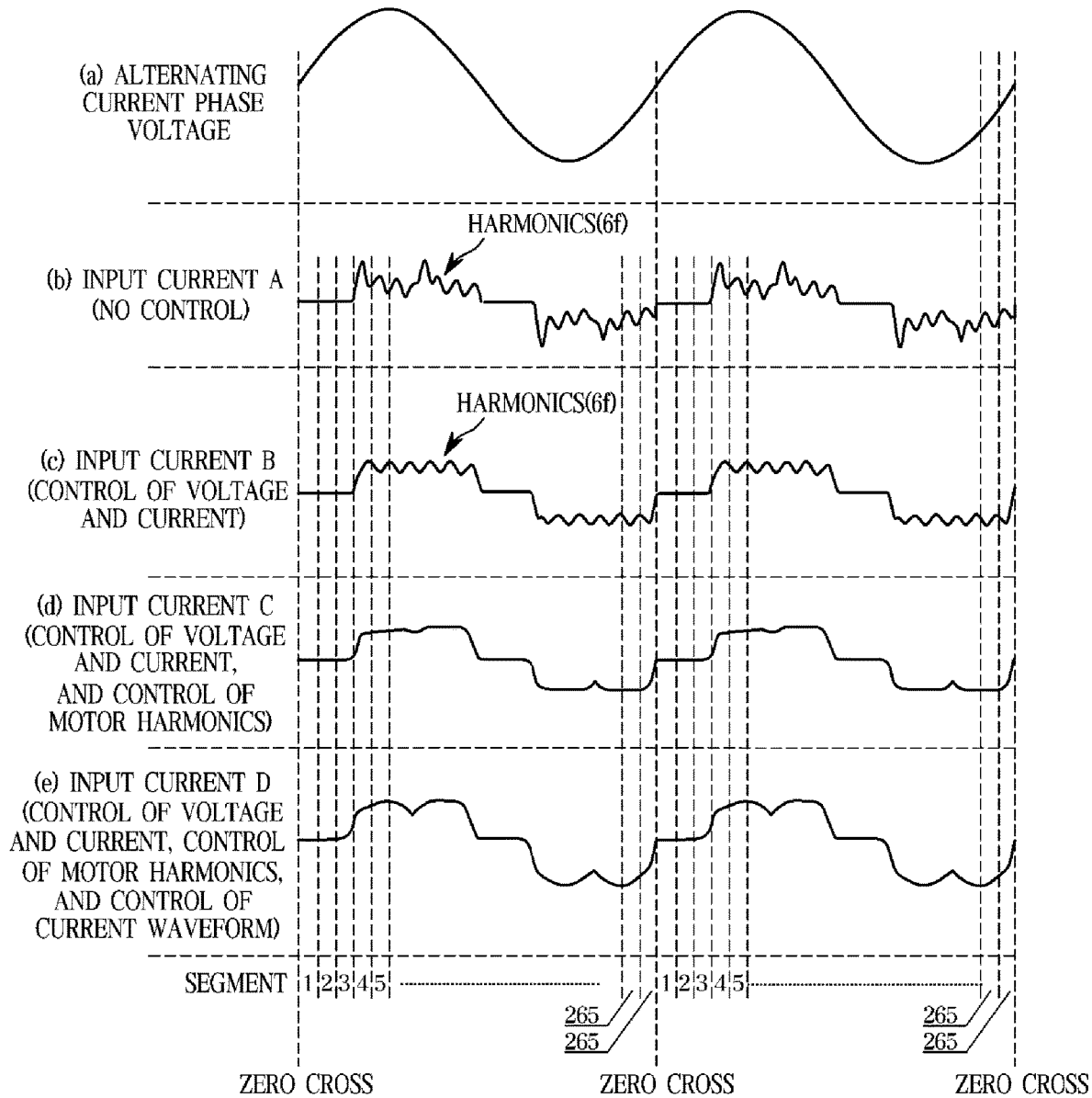
FIG. 5 illustrates a view for describing an embodiment, wherein (a) shows a waveform of an alternating current phase voltage which a power source supplies to a motor apparatus, (b) shows a waveform of input current A input to the motor apparatus when the controller of FIG. 3 performs no control, (c) shows a waveform of input current B input to the motor apparatus when a voltage control block and a current control block are used in the controller of FIG. 3, (d) shows a waveform of input current C input to the motor apparatus when a motor harmonic control block is used in the controller of FIG. 3 in addition to the voltage control block and the current control block, and (e) shows a waveform of input current D input to the motor apparatus when a current waveform control block is used in the controller of FIG. 3 in addition to the voltage control block, the current control block, and the motor harmonic control block.

FIG. 5 illustrates a view for describing an embodiment, wherein (a) shows a waveform of an alternating current phase voltage which the power source 200 supplies to the motor apparatus 100, (b) shows a waveform of input current A input to the motor apparatus 100 when the controller 30 of FIG. 3 performs no control, (c) shows a waveform of input current 13 input to the motor apparatus 100 when the voltage control block 31 and the current control block 33 are used in the controller 30 of FIG. 3, (d) shows a waveform of input current C input to the motor apparatus 100 when the motor harmonic control block 34 is used in the controller 30 of FIG. 3 in addition to the voltage control block 31 and the current control block 33, and (e) shows a waveform of input current D input to the motor apparatus 100 when the current waveform control block 32 is used in the controller 30 of FIG. 3 in addition to the voltage control block 31, the current control block 33, and the motor harmonic control block 34.

In (a) of FIG. 5, two periods of an alternating current phase voltage waveform which is a sine wave are shown.

As shown in (b) of FIG. 5, when control shown in FIG. 3 is not performed, a waveform of input current A input to the motor apparatus 100 may include harmonics 6f which are 6 times an electrical angle frequency f of the motor 2, while having a poor follow-up property with respect to an alternating current phase voltage waveform. Also, the harmonics 6f may be high-frequency vibrations appearing in the input current A.

As shown in (c) of FIG. 5, when the voltage control block 31 and the current control block 33 are used in the controller 30 of FIG. 3, a waveform of input current B input to the motor apparatus 100 may become a little similar to the alternating current phase voltage waveform, but include harmonics 6f which are 6 times the electrical angle frequency f of the motor 2. Also, due to resonance between the impedance of the power source 200 and the capacitors C1 and C2, input current may diverge. The input current B may suppress resonance by using the current control block 33, while suppressing variations of the DC link voltage by the voltage control block 31. Therefore, even when the power source 200 has different impedance, stable voltage control and/or current control may be possible.

As shown in (d) of FIG. 5, when the motor harmonic control block 34 is used in the controller 30 of FIG. 3 in addition to the voltage control block 31 and the current control block 33, a waveform of input current C input to the motor apparatus 100 may suppress harmonics 6f which are 6 times an electrical angle frequency f of the motor 2.

As shown in (e) of FIG. 5, when the current waveform control block 32 is used in the controller 30 of FIG. 3 in addition to the voltage control block 31, the current control block 33, and the motor harmonic control block 34, a waveform of input current D input to the motor apparatus 100 may have a high follow-up property with respect to the alternating current phase voltage waveform.

That is, when the voltage control block 31 and the current control block 33 are used in the controller 30, a current waveform (input current B and C) may become similar to a waveform following the alternating current phase voltage waveform. However, when the current waveform control block 32 is added, a current waveform (input current D) may become a waveform further following the alternating current phase voltage waveform.

The current waveform control block 32 may apply target current having a frequency which is three times an alternating-current voltage. The reason is because when the power source 200 is three-phase alternating current, a timing (period) for which no current flows on each phase of the power source 200 is generated. For example, as shown in (b) to (e) of FIG. 5, no current flows for segments 1, 2, and 3. Accordingly, by applying target current having a frequency which is three times the alternating-current voltage to control the current waveform, the IEC standard may be satisfied.

In an embodiment, the power source 200 is three-phase alternating current. However, in another embodiment, a power source 210 is single-phase alternating current.

Figure 6:
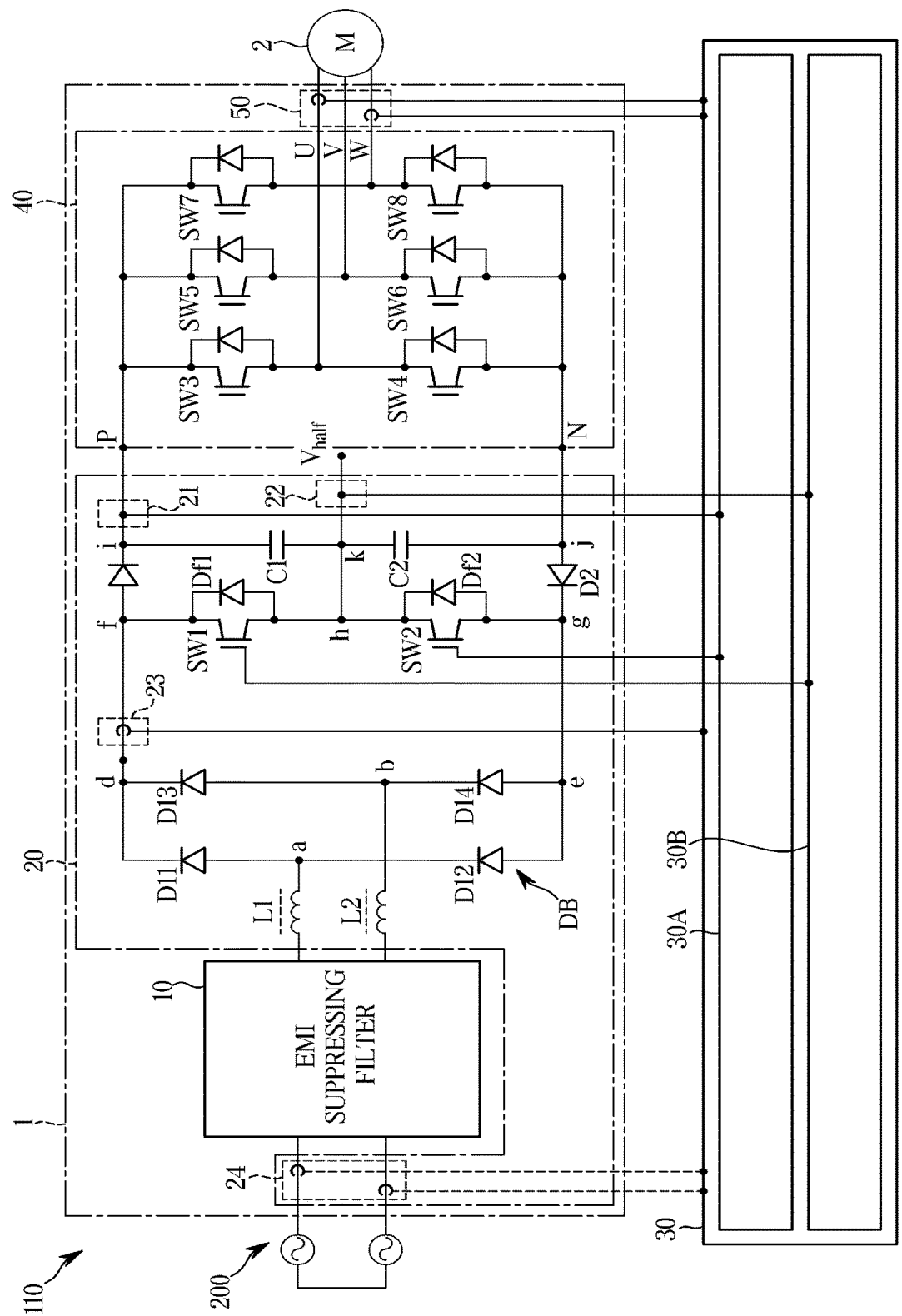
FIG. 6 illustrates a circuit diagram of an example of a motor apparatus.

FIG. 6 illustrates a circuit diagram of an example of a motor apparatus 110 to which another embodiment is applied.

In an embodiment, the motor apparatus 110 may include a power supply 1 and a motor 2. The motor apparatus 110 may be connected to a power source 210 which is single-phase alternating current. The power source 210 may be another example of alternating-current power. Components of this embodiment may be the same as those of another embodiment, except that single-phase alternating current is used instead of three-phase alternating current. Accordingly, the components of this embodiment will be assigned the same reference numerals as those assigned to the corresponding components of another embodiment, and descriptions thereof will be omitted.

In an embodiment, a transfer function of the current-waveform setting factor 321 of the current waveform control block 32 in the block diagram shown in FIG. 3 may be $A*|\sin(\theta)|$. In the single-phase alternating current, it is easy to satisfy the IEC standard since a period for which no current flows on the phase is not generated.

A motor apparatus 120 according to an embodiment may be different from the motor apparatus 100, in view of the configurations of the motor apparatus 100 and the rectifier 20.

Figure 7:
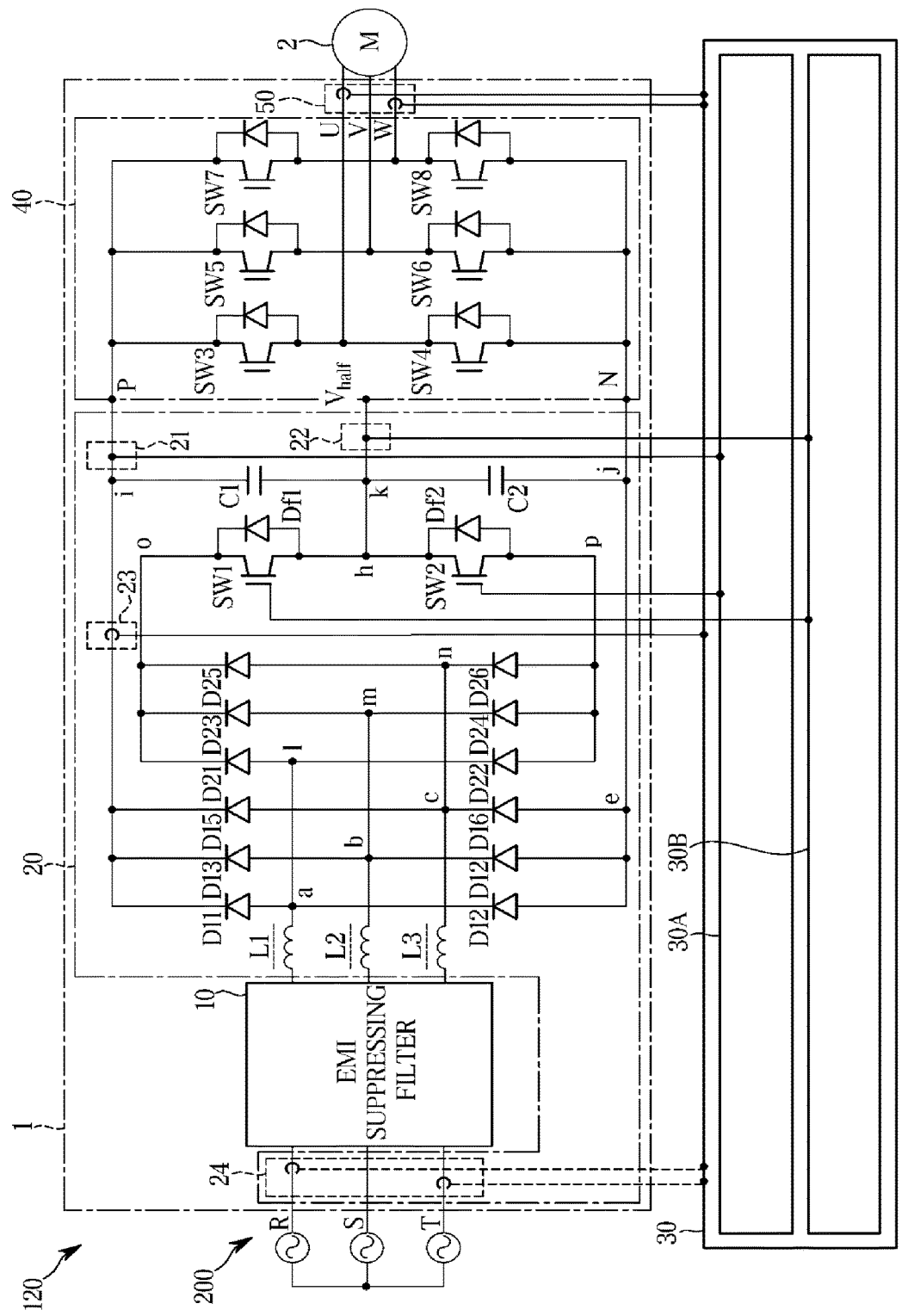
FIG. 7 illustrates a circuit diagram of an example of a motor apparatus.

FIG. 7 illustrates a circuit diagram of an example of the motor apparatus 120. The components of the motor apparatus 120 according to an embodiment will be assigned the same reference numerals as those assigned to the corresponding components of the motor apparatus 100, and descriptions thereof will be omitted. Also, the power source 200 may be three-phase alternating current.

The rectifier 20 of the motor apparatus 120 may further include diodes D21 to D26 in the rectifier 20 of the motor apparatus 100. The diodes D21 and D22 may be connected in series to a node 1, the diodes D23 and D24 may be connected in series to a node m, and the diodes D25 and D26 may be connected in series to a node n. The diodes D21 to D26 may be connected in parallel between a node o and a node p. The diodes D21 to D26 may be connected in a direction in which current flows from the node p to the node o. The node 1 of the diodes D21 and D22 connected in series to each other may be connected to the R phase of the power source 200 via the inductor L1 and the EMI suppressing filter 10. The node m of the diodes D23 and D24 connected in series to each other may be connected to the S phase of the power source 200 via the inductor L2 and the EMI suppressing filter 10. The node n of the diodes D25 and D26 connected in series to each other may be connected to the T phase of the power source 200 via the inductor L3 and the EMI suppressing filter 10.

Also, the switching devices SW1 and SW2 connected in series to each other may be connected between the node o and the node p. Also, the capacitors C1 and C2 connected in series to each other may be connected between the node i and the node j, like the motor apparatus 100. Also, the node h of the switching devices SW1 and SW2 may be connected to the node k of the capacitors C1 and C2. An intermediate potential $V_{half}$ may be acquired from the node k.

Now, operations of the motor apparatus 120 will be described.

As shown in FIG. 2, a case in which the potential of the R phase is higher than the potential of the T phase will be described.

When the switching device SW1 is turned off and the switching device SW2 is turned on, electron energy may be accumulated in the inductors L1 and L3, and the capacitor C1 may be charged. That is, current may flow from the R phase to the T phase via the inductor L1, the capacitor C1, the switching device SW2, the diode D26, and the inductor L3. Accordingly, electron energy may be accumulated in the inductors L1 and L3, and the capacitor C1 may be charged with an alternating-current voltage of the power source 200.

Thereafter, when the switching device SW2 is turned off so that the switching devices SW1 and SW2 are turned off, the electron energy accumulated in the inductors L1 and L3 may be discharged. That is, current may flow from the R phase to the T phase via the inductor L1, the diode D11, the capacitors C1 and C2, the diode D16, and the inductor L3. Accordingly, the capacitors C1 and C2 may be charged.

Successively, when the switching device SW1 is turned on so that the switching device SW1 is in a turned-on state and the switching device SW2 is in a turned-off state, electron energy may be accumulated in the inductors L1 and L3, and the capacitor C2 may be charged. That is, current may flow from the R phase to the T phase via the inductor L1, the diode D21, the switching device SW1, the capacitor C2, the diode D16, and the diode L3. Accordingly, electron energy may be accumulated in the inductors L1 and L3, and the capacitor C2 may be charged with an alternating-current voltage of the power source 200.

Thereafter, when the switching device SW1 is turned off so that the switching devices SW1 and SW2 are turned off, electron energy accumulated in the inductors L1 and L3 may be discharged. That is, current may flow from the R phase to the T phase via the inductor L1, the diode D11, the capacitors C1 and C2, the diode D16, and the inductor L3. Accordingly, the capacitors C1 and C2 may be charged.

Then, a voltage between both terminals (the node i and the node j) of the capacitors C1 and C2 connected in series to each other may be controlled (raised) by a time (on-duty time) for which the switching devices SW1 and SW2 are in a turned-on state. Also, an intermediate potential $V_{half}$ may be acquired from the node k between the capacitors C1 and C2 connected in series to each other.

As described above, the rectifier 20 of the motor apparatus 120 may include, like the rectifier 20 of the motor apparatus 100, the capacitors C1 and C2 connected in series to each other, wherein the capacitors C1 and C2 are respectively switched by the switching devices SW1 and SW2 to be charged. Accordingly, the motor apparatus 120 may include the same controller 30 (the control units 30A and 30B) as the motor apparatus 100, so as to be controlled in the same manner as the motor apparatus 100. Also, the controller 30 (control units 30A and 30B) may detect current flowing between the node d and the node i of the rectifier 20.

Also, the motor apparatus 120 applied may be connected to the power source 200 which is three-phase alternating current, however, the motor apparatus 120 may be connected to the power source 210 which is single-phase alternating current, like the motor apparatus 110.

In the power supply 1 of the motor apparatuses 100, 110, and 120, the capacitors C1 and C2 of the rectifier 20 may be electrolytic capacitors. However, since the capacitors C1 and C2 are charged by the controller 30, the capacitors C1 and C2 may be film capacitors or ceramic capacitors having a smaller capacity than electrolytic capacitors to obtain a stable DC link voltage. Film capacitors or ceramic capacitors may have a small size and a long lifetime compared to electrolytic capacitors. Also, as described above, small-sized inductors may be used as the inductors L1, L2, and L3. Accordingly, the motor apparatuses 100, 110, and 120 may be compact-sized and have a long lifetime.

Also, in the power supply 1 of the motor apparatuses 100, 110, and 120, the rectifier 20 may use two capacitors C1 and C2 and two switching devices SW1 and SW2 to obtain an arbitrary output voltage (DC link voltage) having a boosting rate of 1 or greater. When three or more capacitors and switching devices are used, a higher output voltage (DC link voltage) will be obtained.

Also, the power source 200 which is three-phase alternating current, as shown in FIGS. 1 to 7, is a star-shaped wiring. However, the power source 200 may be a delta-shaped wiring. Also, the phase of input current may be adjusted to satisfy the IEC standard.

Also, in various embodiments, the motor apparatuses 100, 110, and 120 are used, however, the power supply 1 may supply an output to the motor 2, etc. Also, the rectifier 20 of the power supply 1 may be used as a rectifying apparatus.

Also, the motor apparatuses 100, 110, and 120 may be installed in an air conditioner.

According to the above-described embodiments, the air conditioner and the rectifier capable of suppressing harmonic current controlling an output voltage to a predetermined value may be provided.

Meanwhile, at least one component may be added or at least one of the above-described components may be omitted in correspondence to the performance of components of a rectifying apparatus, a power apparatus, and an air conditioner. Also, it may be easily understood to one of ordinary skill in the art that the relative locations of the components can be changed in correspondence to the performance and structure of the system.

Also, some components shown in FIGS. 1 to 7 may be hardware components, such as software and/or Field Programmable Gate Array (FPGA) and Application Specific Integrated Circuit (ASIC).

Also, the disclosed embodiments may be implemented in the form of a recording medium that stores commands executable by a computer. The commands may be stored in the form of a program code, and when executed by a processor, the commands may create a program module to perform operations of the disclosed embodiments. The recording medium may be implemented as a computer-readable recording medium.

The computer-readable recording medium may include all kinds of recording media storing commands that can be interpreted by a computer. For example, the recording media may include Read Only Memory (ROM), Random Access Memory (RAM), a magnetic tape, a magnetic disc, flash memory, an optical data storage device, etc.

Although a few embodiments of the present disclosure have been shown and described, it would be appreciated by those skilled in the art that changes may be made in these embodiments without departing from the principles and spirit of the disclosure, the scope of which is defined in the claims and their equivalents.

Although the present disclosure has been described with various embodiments, various changes and modifications may be suggested to one skilled in the art. It is intended that the present disclosure encompass such changes and modifications as fall within the scope of the appended claims.

What is claimed is:

1. An air conditioner comprising:
   a rectifier including:
     a plurality of capacitors connected in series to each other,
     a switching device configured to charge or discharge the plurality of capacitors, respectively,
     a voltage detector configured to detect an output voltage of the plurality of capacitors, and
     a current detector configured to detect current;
   an inverter configured to generate alternating current by receiving an output voltage of the rectifier; and
   at least one processor configured to:
     identify a voltage difference value between the output voltage detected by the voltage detector and a predetermined target voltage,
     identify a target current based on the voltage difference value and a current-waveform correction value, and
     control the switching device to switch a flow of a current supplied to the plurality of capacitors based on the current detected by the current detector and a waveform, which is set based on the current-waveform correction value, of the target current.

2. The air conditioner of claim 1, further comprising a diode bridge connected in parallel to the switching device and the current detector is configured to detect output current of the diode bridge.

3. The air conditioner of claim 1, further comprising a second current detector configured to detect a current of a power source for supplying a voltage to the rectifier.

4. The air conditioner of claim 1, wherein the voltage detector includes a plurality of voltage detectors configured to detect the output voltage of the plurality of capacitors, respectively.

5. The air conditioner of claim 1, wherein the at least one processor is configured to:
   calculate the target current based on a comparison between the output voltage detected by the voltage detector and the predetermined target voltage,
   compare the target current with the current detected by the current detector, and
   control the switching device based on a result of the comparison between the target current and the current detected by the current detector.

6. The air conditioner of claim 1, wherein the at least one processor is configured to:
   calculate the target current based on a comparison between the output voltage detected by the voltage detector and the predetermined target voltage.

7. The air conditioner of claim 1, wherein the at least one processor is configured to:
   set the waveform of the target current such that the target current satisfies a predetermined harmonic standard, and
   control the switching device such that the current detected by the current detector has the set waveform of the target current.

8. The air conditioner of claim 1, wherein:
   the voltage detector includes a plurality of voltage detectors configured to detect output voltages of the plurality of capacitors, respectively, and
   the at least one processor is further configured to compare the output voltages of the plurality of capacitors with a plurality of predetermined target voltages, respectively, for the plurality of voltage detectors.

9. The air conditioner of claim 1, wherein the switching device comprises a plurality of switching devices configured to:
   control flows of the current that are supplied to the plurality of capacitors to charge the plurality of capacitors, respectively.

10. The air conditioner of claim 9, wherein the at least one processor is further configured to control each of the plurality of switching devices independently.

11. The air conditioner of claim 10, wherein the at least one processor is further configured to control a duty rate of the plurality of switching devices.

12. An air conditioner comprising:
   a rectifier including:
     a plurality of capacitors connected in series to each other and configured to supply a plurality of output voltages from both (i) terminals of the plurality of capacitors and (ii) a node between the plurality of capacitors,
     a plurality of switching devices configured to charge the plurality of capacitors individually,
     a plurality of voltage detectors configured to detect the plurality of output voltages, respectively, and
     a current detector configured to detect direct current;
   an inverter configured to receive a voltage that is output from the rectifier and to generate alternating current; and
   at least one processor configured to:
     identify a plurality of voltage difference values between the plurality of output voltages detected by the plurality of voltage detectors and a plurality of target voltages decided for the plurality of output voltages, identify a plurality of target currents based on the plurality of voltage difference values and current-waveform correction values to a target current, and control the plurality of switching devices to switch direct current rectified from the alternating current based on the direct current detected by the current detector and waveforms, which are set based on the current-waveform correction values, of the plurality of target currents.

13. The air conditioner of claim 12, wherein the current detector is installed at an alternating current supply side of a power source, rather than a side of the plurality of voltage detectors.

14. The air conditioner of claim 12, wherein the at least one processor is configured to set a target current to correspond to a harmonic standard.

15. The air conditioner of claim 14, wherein a target voltage is set for each of the plurality of output voltages.

16. The air conditioner of claim 14, wherein a target current among the plurality of target currents is a first value obtained by adding an offset value to an absolute value of a sine wave having a frequency which is three times a supplied alternating current frequency or an absolute value of a sine wave of the supplied alternating current frequency.

17. The air conditioner of claim 16, wherein the at least one processor is further configured to:

segment a unit period for repetition set to include at least one period of a waveform representing the target current into a plurality of segments, and control the plurality of switching devices for each of the plurality of segments.

18. The air conditioner of claim 17, wherein the at least one processor is further configured to control the plurality of switching devices by using a second value obtained by calculating a difference between the target current and current detected for a first segment immediately before a second segment through an integral factor.

19. An apparatus comprising:
a rectifier including:
    a plurality of capacitors connected in series to each other,
    a plurality of inductors connected respectively to different phases of a power source,
    a switching device configured to charge or discharge the plurality of capacitors,
    a voltage detector configured to detect an output voltage of the plurality of capacitors, and
    a current detector configured to detect current;
an inverter configured to generate alternating current by receiving an output voltage of the rectifier; and
at least one processor configured to:
    identify a voltage difference value between the output voltage detected by the voltage detector and a predetermined target voltage,
    identify a target current based on the voltage difference value and a current-waveform correction value, and
    control the switching device to switch a flow of a current supplied to the plurality of capacitors based on the current detected by the current detector and a waveform, which is set based on the current-waveform correction value, of the target current.

20. An air conditioner comprising:
a rectifier including:
    a plurality of capacitors connected in series to each other,
    a switching device configured to charge or discharge the plurality of capacitors, respectively,
    a voltage detector configured to detect an output voltage of the plurality of capacitors, and
    a current detector configured to detect current;
an inverter configured to generate alternating current by receiving an output voltage of the rectifier; and
at least one processor configured to:
    identify a voltage difference value between the output voltage detected by the voltage detector and a predetermined target voltage,
    convert the voltage difference value to a target current,
    control the switching device to switch a flow of a current supplied to the plurality of capacitors based on the current detected by the current detector and a waveform of the target current, and
    calculate the target current based on a comparison between the output voltage detected by the voltage detector and the predetermined target voltage.

21. The air conditioner of claim 20, wherein the at least one processor is configured to:
    calculate the target current based on a comparison between the output voltage detected by the voltage detector and the predetermined target voltage;
    compare the target current with the current detected by the current detector; and
    control the switching device based on a result of the comparison between the target current and the current detected by the current detector.

* * * * *